United States Patent
Santhanam et al.

(10) Patent No.: US 8,990,447 B1
(45) Date of Patent: Mar. 24, 2015

(54) METHODS FOR EMBEDDING AN OUT-OF-BAND SIGNAL INTO A USB CAPTURE STREAM

(75) Inventors: Kumaran Santhanam, Sunnyvale, CA (US); Gopal Santhanam, Sunnyvale, CA (US); Etai Bruhis, Palo Alto, CA (US)

(73) Assignee: Total Phase, Inc., Sunnyvale, CA (US)

( * ) Notice: Subject to any disclaimer, the term of this patent is extended or adjusted under 35 U.S.C. 154(b) by 296 days.

(21) Appl. No.: 12/416,102

(22) Filed: Mar. 31, 2009

Related U.S. Application Data

(60) Provisional application No. 61/041,077, filed on Mar. 31, 2008.

(51) Int. Cl.
```
G06F 3/00       (2006.01)
G06F 5/00       (2006.01)
G06F 13/42      (2006.01)
G06F 13/00      (2006.01)
G06F 11/00      (2006.01)
H03M 13/00      (2006.01)
G08C 25/00      (2006.01)
H04L 12/40      (2006.01)
```
(52) U.S. Cl.
USPC .............. 710/16; 710/15; 710/18; 710/19; 710/52; 710/55; 710/56; 710/105; 710/109; 714/39; 714/45; 714/709; 714/799; 370/438

(58) Field of Classification Search
CPC .......... G06F 13/387; G06F 2213/0042; G06F 13/385; G06F 2212/7209; G06F 13/36; G06F 13/38; G06F 1/1698; G06F 21/554; G06F 2213/3812; G06F 7/605; H04B 5/0043; H04L 1/1685; H04L 29/06; H04L 41/06; H04L 65/60; H04L 69/18
USPC ......... 710/15–19, 52–57, 105, 109, 306, 311; 714/39, 724; 341/68; 370/438
See application file for complete search history.

(56) References Cited

U.S. PATENT DOCUMENTS 6,993,620 B2 * 1/2006 Ferguson ...................... 710/313
7,103,512 B2 * 9/2006 Julicher et al. ................ 702/188

(Continued)

OTHER PUBLICATIONS

Catalyst Enterprises Inc., "Conquest Series USB Protocol Analyzers," product specification, 2006, entire document relevant.

(Continued)

Primary Examiner — Farley Abad
Assistant Examiner — Henry Yu
(74) Attorney, Agent, or Firm — Van Pelt, Yi & James LLP

(57) ABSTRACT

One or more out-of-band input signals (GPIO) are handled and efficiently embedded into a USB capture stream. In order to conserve resources, the state of the input signals can be sent only when a change occurs. The signals are accurately time-stamped, and then presented within the context of the captured USB data. In order to provide maximum visibility, if the digital inputs occur during a normally filtered multi-packet sequence, the filter is canceled and the surrounding packets will also be sent to an analysis computer. Furthermore, because digital inputs may happen during a USB packet, the digital inputs are queued in a FIFO buffer until there is an opportunity to send the digital inputs. Even though the state of the inputs may be sent at a later time, the state of the inputs may be time-stamped when the state of the inputs is perceived by the analyzer.

25 Claims, 7 Drawing Sheets

(56) References Cited

U.S. PATENT DOCUMENTS

| | | | | |
|---|---|---|---|---|
| 7,212,497 | B2* | 5/2007 | Keys | 370/252 |
| RE40,541 | E * | 10/2008 | Korhonen | 714/25 |
| 7,590,710 | B1* | 9/2009 | Kokal et al. | 709/219 |
| 7,751,990 | B2* | 7/2010 | Kerrigan et al. | 702/34 |
| 7,765,460 | B2* | 7/2010 | DiFalco et al. | 714/799 |
| 7,822,907 | B2* | 10/2010 | Slaight | 710/311 |
| 2002/0078283 | A1* | 6/2002 | Purcell et al. | 710/109 |
| 2003/0063018 | A1* | 4/2003 | Warren et al. | 341/68 |
| 2003/0165230 | A1* | 9/2003 | Reuss | 379/265.02 |
| 2003/0212937 | A1* | 11/2003 | Todd et al. | 714/724 |
| 2006/0010349 | A1* | 1/2006 | Dun et al. | 714/39 |
| 2006/0271677 | A1* | 11/2006 | Mercier | 709/224 |
| 2007/0058657 | A1* | 3/2007 | Holt et al. | 370/438 |
| 2007/0159221 | A1* | 7/2007 | Ma et al. | 327/141 |
| 2008/0028114 | A1* | 1/2008 | Mun | 710/105 |
| 2009/0164690 | A1* | 6/2009 | Slaight | 710/306 |

OTHER PUBLICATIONS

Catalyst Enterprises Inc., "Bus & Protocol Analyzers," product specification, 2005, entire document relevant.
Catalyst Enterprises Inc., "USB 1.x/2.0 Analyzer Exerciser Tester," product specification, entire document relevant.
Ellisys, "Ellisys USB Explorer 260 Getting Started Guide," manual, Nov. 22, 2007, entire document relevant.
Ellisys, "Ellisys USB Explorer 200 Getting Started Guide," manual, Feb. 13, 2006, entire document relevant.
Ellisys, "Ellisys USB Tracker 110 Getting Started Guide," manual, Feb. 13, 2006, entire document relevant.
Finisar Corporation, "Bus Doctor™ RX Analyzer," product specification, entire document relevant.
Hitex, "USB Agent Explores the secrets of USB," brochure, Jun. 2001, entire document relevant.
LeCroy Corporation, "LeCroy Advisor™ USB 2.0 Bus and Protocol Analyzer User Manual," user manual, Jul. 2007, entire document relevant.
Computer Access Technology Corporation, "CATC™ USB Chief™ Bus & Protocol Analyzer User's Manual," user manual, Nov. 9, 2001, entire document relevant.
LeCroy Corporation, "LeCroy USBMobileHS™ Protocol Analyzer User Manual," user manual, Jul. 2007, entire document relevant.
LeCroy Corporation, "LeCroy USBTracer™ USB 2.0 Design & Verification System User Manual," user manual, Jul. 2007, entire document relevant.
Author Unknown, "Universal Serial Bus Specification," specification, Apr. 27, 2000, entire document relevant.
Crescent Heart Software, "USB-2XP Probe Adapter and Software Users' Manual," user manual, Jun. 2003, entire document relevant.
Crescent Heart Software, "Industrial-Strength USB Probing Products," brochure, Sep. 2004, entire document relevant.
Futureplus Systems Corporation, "USB Universal Serial Bus," user manual, 1998, entire document relevant.
Futureplus Systems Corporation, "USB Universal Serial Bus Analyzer," brochure, 2001, entire document relevant.
Futureplus Systems Corporation, "USB Analysis Probe FS4100," instruction manual, entire document relevant.
Futureplus Systems Corporation, "USB2.0 Analysis Probe Users Manual—FS4120," user manual, 2001, entire document relevant.
Futureplus Systems Corporation, "Universal Serial Bus Analyzer," brochure, 2001, entire document relevant.
Futureplus Systems Corporation, "FS4120 USB Bus Analyzer Quick Start Instructions," instruction manual, entire document relevant.

* cited by examiner

US 8,990,447 B1

METHODS FOR EMBEDDING AN OUT-OF-BAND SIGNAL INTO A USB CAPTURE STREAM

CROSS REFERENCE

This application claims priority from a provisional patent application entitled "Robust Out-of-band, Multiple Input Signals Embedded in a USB Capture Stream" filed on Mar. 31, 2008 and having an Application No. 61/041,077. Said application is incorporated herein by reference.

FIELD OF INVENTION

This invention relates to methods for generating a Universal Serial Bus ("USB") capture stream, and, in particular, to methods for embedding one or more out-of-band signals into a single analysis stream.

BACKGROUND

The currently available technologies fall under two classes. The first class is protocol analyzers, and the second class is digital logic analyzers that have communication parsing solutions. Protocol analyzers do not provide methods for allowing out-of-band signals to be captured in the context of a USB stream. The out-of-band signals are signals that are not a part of the USB signaling scheme or USB data stream; they may also be referred to as digital inputs. At best, these protocol analyzers provide a way for triggering a capture of data and allowing for a certain amount of pre-triggered data to be captured. They do not, however, allow users to see the state of a non-USB-related signal.

It is fairly common to see protocol analyzers with the ability to trigger or start a capture based on some external input signal. However, protocol analyzers typically do not have the ability to tag non-USB-related external events and present these events within the context of a monitored data stream. Such inputs to the analyzer can be used in any number of ways, and can be left as general as possible so that a user may use the data as the user sees fit.

Alternatively, digital logic analyzers or high-end oscilloscopes can be configured in a complicated manner to achieve some aspect of this goal. However, these analyzers and oscilloscopes do not operate in the same way as protocol analyzers because they are meant to be general purpose measurement tools. Accordingly, these analyzers and oscilloscopes simply sample all monitored lines at the fastest rate possible and do not differentiate between USB specific signals and non-USB signals.

FIG. 1 illustrates a block diagram for a protocol analyzer using a prior art method. A USB circuitry 2 transmits USB data that is sensed by a packet logic 4. The sensed USB data is then stored in a packet first-in-first-out ("FIFO") buffer 6. The data in the packet FIFO buffer 6 is written to an analysis computer (herein referred to as a "PC").

FIG. 2 illustrates a returned data stream for a protocol analyzer using a prior art method. When an analyzer senses a USB packet, the packet is transmitted in a data stream with a timestamp of when the USB packet was detected. For instance, when the analyzer detects a USB packet A at time t0, the analysis stream reflects this by generating the USB packet A with the timestamp t0. However, the analyzer does not provide information regarding the changing digital input. As the state of the digital input signal changes from low to high at time t1, or high to low at time t3, the analysis stream does not reflect these changes. Therefore, it is desirable to provide methods and circuits to generate a data stream that reflects the various states of the digital input signal and the user data.

Digital logic analyzers and some high-end oscilloscopes provide users with the ability to capture signals transmitted over communication lines, and provide some level of parsing of the captured data. Due to the nature of these devices, it is trivial to display other non-protocol-related lines within the same viewing window. These analyzers and oscilloscopes, however, do not provide the same streaming capabilities, nor advanced filtering techniques, that are prevalent in protocol analyzers. Furthermore, these analyzers and oscilloscopes must provide equal resources for USB and non-USB signals since they are general purpose measurement tools, where each signal is sampled and its value stored in order to preserve the general purpose quality of the logic analyzer. Therefore, it is desirable to provide methods and circuits that overcome these limits of the prior art.

Currently, USB specific protocol analyzers do not provide for displaying or processing of non-protocol-based signals. Although logic analyzers and oscilloscopes can provide visibility to a large number of signals in parallel, and can be used with high-end protocol parsers, they do not provide the same streaming and filtering capabilities of protocol analyzers. Therefore, it is desirable to provide methods for embedding out-of-band signals into a signal analysis stream.

SUMMARY OF INVENTION

An object of this invention is to provide methods for efficiently and intelligently handling one or more out-of-band signals and embedding them into an analysis stream.

Another object of this invention is to provide methods for an analyzer to accurately timestamp the changes in the state of a digital input.

Yet another object of this invention is to provide methods for an analyzer to present digital information within the context of USB data.

Briefly, one or more out-of-band input signals ("GPIO") are handled and efficiently embedded into a USB capture stream. In order to conserve resources, the state of the input signals can be sent only when a change occurs. The signals are accurately time-stamped, and then presented within the context of the captured USB data. In order to provide maximum visibility, if the digital inputs occur during a normally filtered multi-packet sequence, the filter is canceled and the surrounding packets will also be sent to an analysis computer. Furthermore, because digital inputs may happen during a USB packet, the digital inputs may be queued in a FIFO buffer until there is an opportunity to send the digital inputs. Even though the state of the inputs may be sent at a later time, the state of the inputs may be time-stamped when the state of the inputs is perceived by the analyzer.

An advantage of this invention is that methods for efficiently and intelligently handling one or more out-of-band signals and embedding them into a single analysis stream are provided.

Another advantage of this invention is that methods for an analyzer to accurately timestamp the changes in a digital input are provided.

Yet another object of this invention is that methods for an analyzer to present digital information within the context of USB data are provided.

DESCRIPTION OF THE DRAWINGS

The foregoing and other objects, aspects, and advantages of the invention will be better understood from the following detailed description of the preferred embodiment of the invention when taken in conjunction with the accompanying drawings in which.

DETAILED DESCRIPTION OF THE PREFERRED EMBODIMENTS

Figure 1:
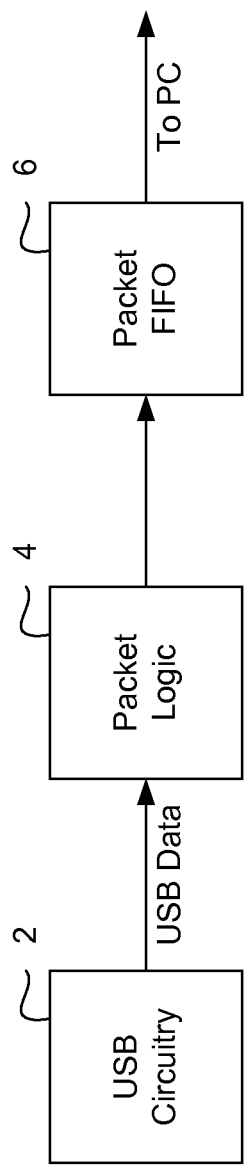
FIG. 1 illustrates a block diagram for a protocol analyzer using a prior art method.
Figure 2:
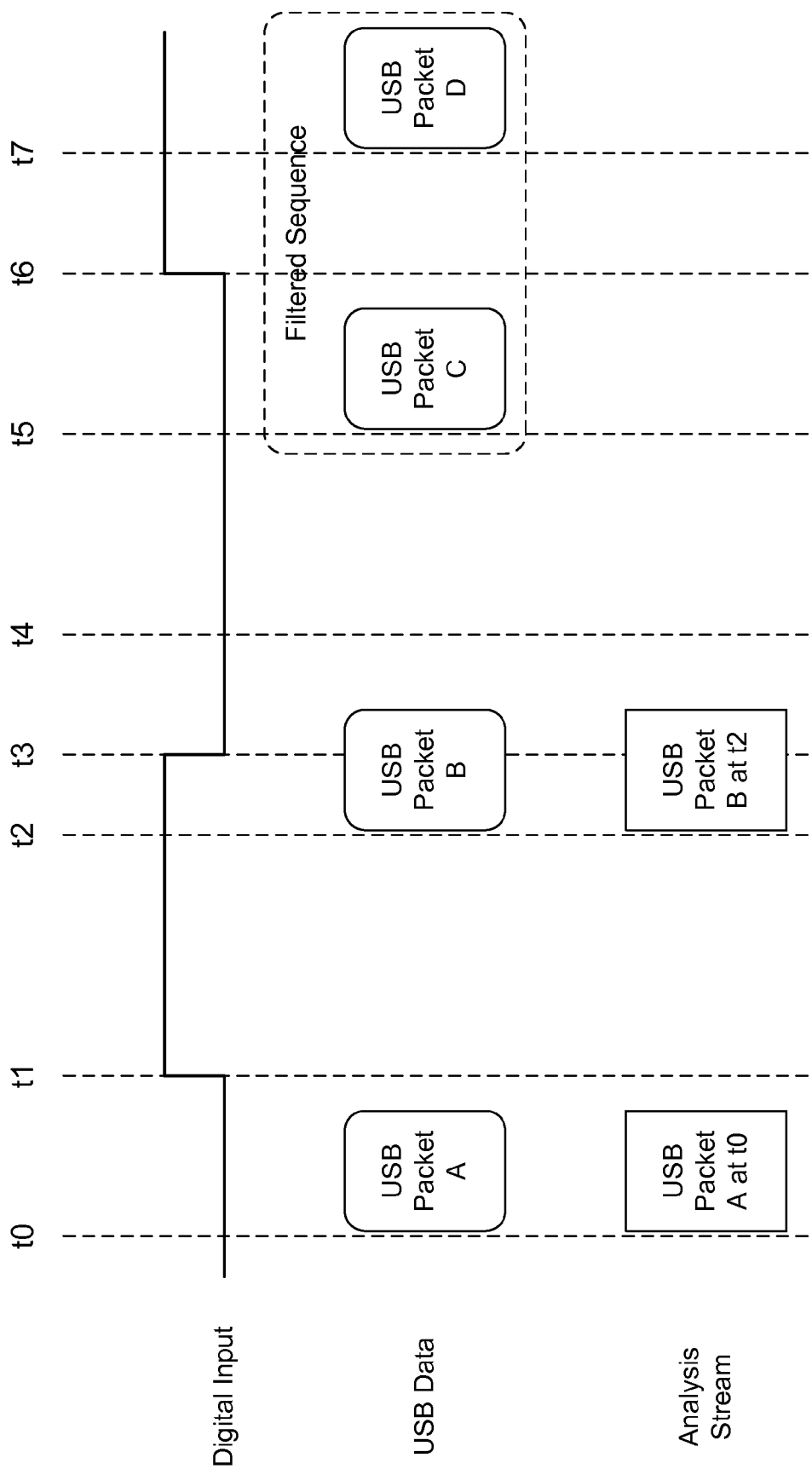
FIG. 2 illustrates a returned analysis stream for a protocol analyzer using a prior art method.
Figure 3:
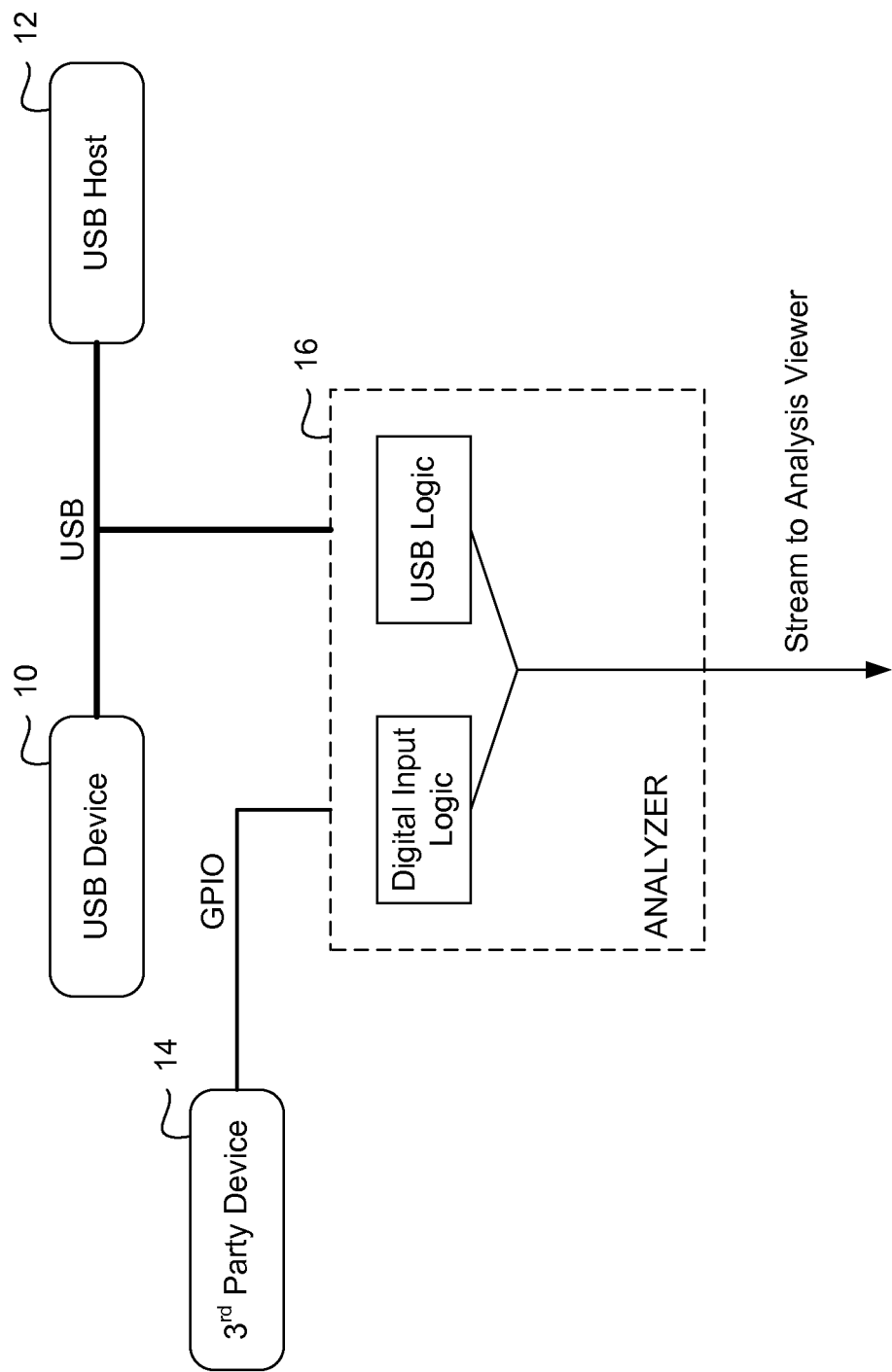
FIG. 3 illustrates a block diagram for monitoring a USB connection and general purpose input signals by an analyzer.

FIG. 3 illustrates a block diagram for monitoring a USB connection and general purpose input signals by an analyzer of the present invention. A USB host 12 and a USB device 10 communicate through USB ports, which are connected with each other via bus lines. An analyzer 16 monitors the bus lines. A general purpose output of a third party device 14 is connected to the analyzer's 16 general purpose input. The third party device 14 can be any device, including the USB host 12, the USB device 10, or other devices. The analyzer 16 combines the USB data and the digital input information and outputs it to an analysis viewer.

In order to minimize memory usage, the state of the input signal can be set to only send data when a change in the monitored line is detected. Additionally, in order to conserve other on-board resources, as well as bandwidth, the information of the input signals may be sent within the same analysis stream as the captured USB data to the analysis viewer. Due to this efficient architecture, an intelligent system can be developed to appropriately handle the different situations that can occur.

Figure 4:
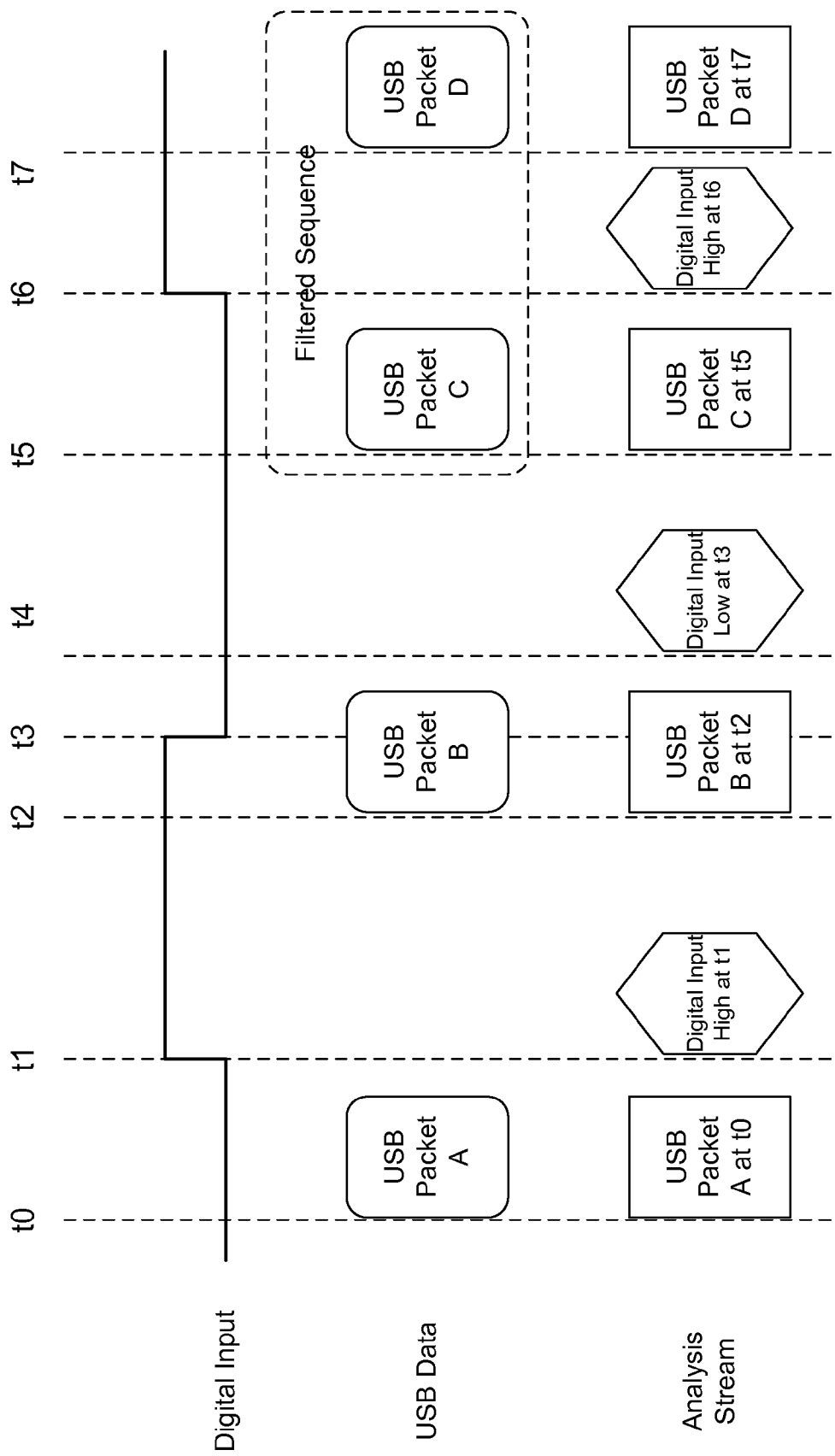
FIG. 4 illustrates a returned analysis stream for an embodiment of the present invention.

FIG. 4 illustrates a returned data stream by an analyzer using an embodiment of the present invention. When an analyzer senses a USB packet, the packet is transmitted in a data stream with a timestamp of when the USB packet was detected. For instance at time t0, a USB packet A is detected by the analyzer. The USB packet A with the timestamp t0 is transmitted in the analysis stream to reflect the detection of the USB packet A.

In addition, all changes of the digital input are accurately time stamped and sent in the analysis stream. For instance, when the digital input signal changes from low to high at time t1, or high to low at time t3, this change is reflected in the analysis stream by transmitting the change and a timestamp of when this change occurred.

The digital input information can even be presented within the context of the USB data during a normally filtered packet sequence. When this occurs, the normally filtered packet sequence is transferred to the PC along with the digital input data so that the digital input data can be presented with the maximum amount of context. For example, in FIG. 4 a digital input change occurs at time t6 in between packets C and D of a normally filtered sequence. Due to the change of the digital input at t6, both packets and the digital input are in the analysis stream sent to the PC (even though the digital input happened after packet C). If the digital input had not occurred between the beginning of packet C and the end of packet D, then those packets would never have appeared in the analysis stream because they would have been filtered out. In an alternative embodiment, this feature can be suppressed.

Figure 5:
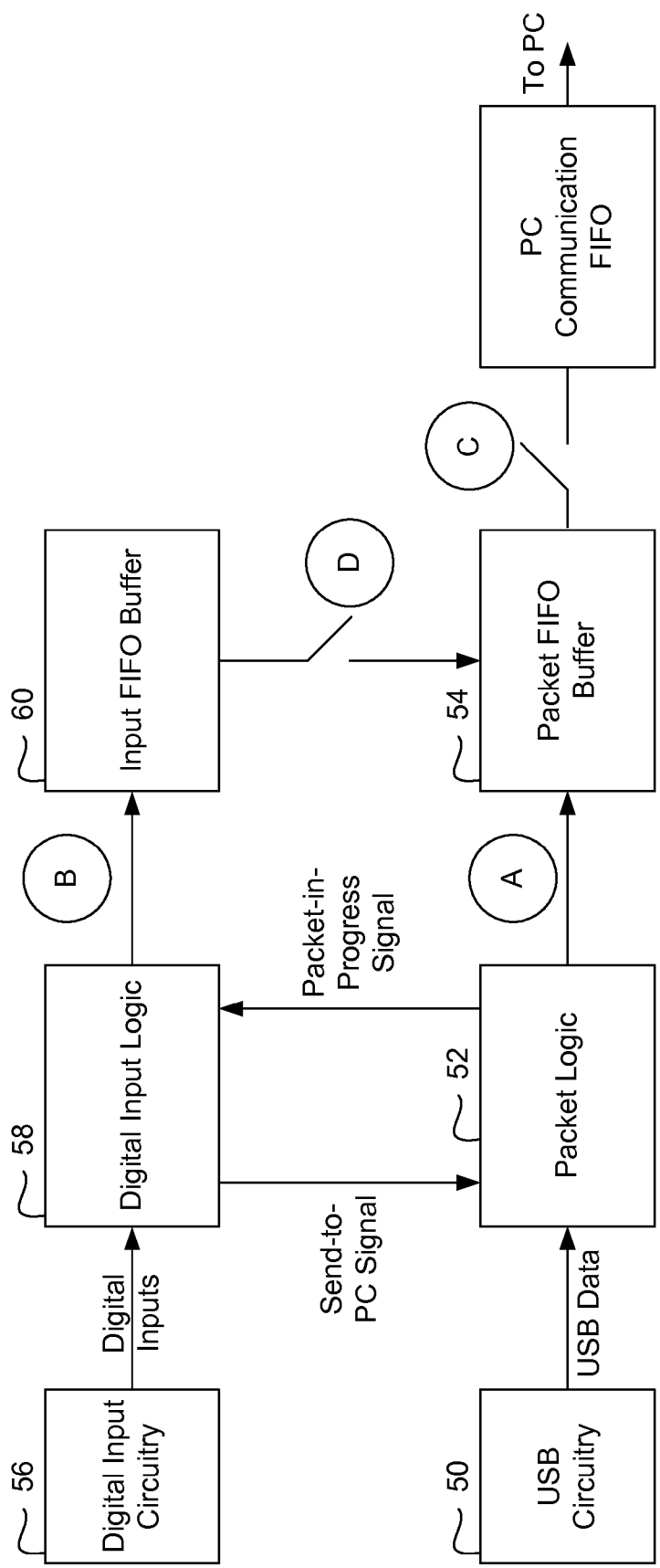
FIG. 5 illustrates a block diagram of the components of the present invention for an analyzer.

FIG. 5 illustrates a block diagram of the components of the present invention for an analyzer. Separate logic is used to handle the GPIOs and the USB data. With respect to the USB logic block, USB circuitry 50 transmits USB data, which is read by a packet logic 52 and stored in a packet buffer 54, wherein the packet buffer 54 can be a FIFO buffer or other data structure. With respect to the GPIO block, digital input circuitry 56 transmits the digital inputs read by a digital input logic 58 and stored in an input buffer 60, where the input buffer 60 can be a FIFO buffer or other data structure. Once the GPIO is processed by the digital input circuitry 56, it is input for the digital input logic 58.

The digital input logic 58 and the packet logic 52 communicate with each other through a send-to-PC flag and a packet-in-progress flag that control the flow of information. The signals and switches A, B, C, and D are explained in detail in FIGS. 6 and 7. In addition, buffering can be shared between the two logical blocks to conserve resources. Ultimately, the data from the digital input circuitry and from the USB circuitry is sent on the same analysis stream to the PC using the PC Communication FIFO.

Figure 6:
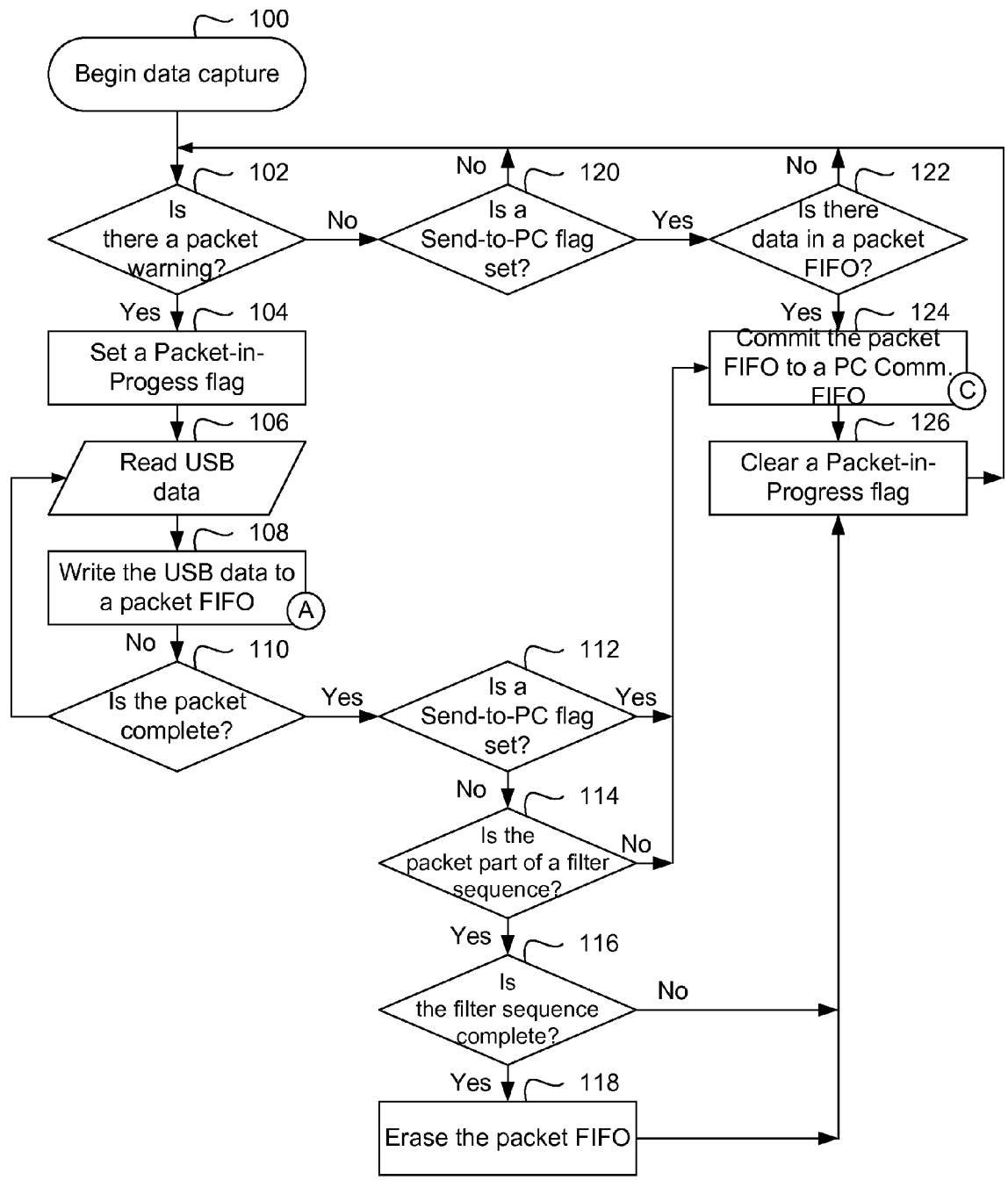
FIG. 6 illustrates a process flow for an embodiment of the present invention to control logic for managing a data capture stream.

FIG. 6 illustrates a process flow for an embodiment of the present invention to control logic for managing a data capture stream. Before a USB packet arrives, a packet warning signal is transmitted, which indicates that a packet will be arriving soon. Thus, when capture begins 100, a controller determines whether there is a packet warning 102.

If the packet warning signal is not activated, then the controller checks if the send-to-PC flag (which is generated by the digital input logic) is activated 120. If the send-to-PC flag is not activated, then it loops back to see if there is a packet warning 102. If the send-to-PC flag is activated, the controller determines whether there is data in the packet FIFO buffer 122. If not, then the controller loops back to check whether there is a packet warning 102.

If there is data in the packet FIFO buffer, the controller commits all the data in the packet FIFO buffer out to the PC Communication FIFO 124 and then clears the packet-in-progress flag 126. After the packet-in-progress flag is cleared, the process of determining whether there is a packet warning 102 restarts.

If the packet warning signal is activated, the controller sets the packet-in-progress flag 104, which is used by the digital input logic. The USB data is read a bit (or a byte) at a time 106, and is written to the packet FIFO buffer 108 until the packet is completely written to the packet FIFO buffer 110. If the packet is not complete, then more data is read 106 until the packet completes.

After completion, the send-to-PC flag is checked as to whether it has been asserted 112. If it has, then all data in the packet FIFO buffer is committed to the PC Communication FIFO 124, effectively ceasing the operation of the filter until another entirely new filter sequence is detected on the bus. If the send-to-PC flag is not asserted (thus, not set), the packet logic checks to see if the packet is a part of a filtered sequence 114.

If the packet does not match any filtered sequence, then all data in the packet FIFO buffer is sent to the PC Communication FIFO 124. If the packet is a part of a filtered sequence, then the logic determines whether the filtered sequence is complete 116. If it is complete, then the data in the packet FIFO buffer is erased 118 and the packet-in-progress flag is cleared 126. If the filtered sequence is not complete, then it is saved in the packet FIFO buffer until a later point at which a decision can be made. Regardless of the situation, the packet-in-progress flag is cleared 126 after the handling of the packet is complete.

Figure 7:
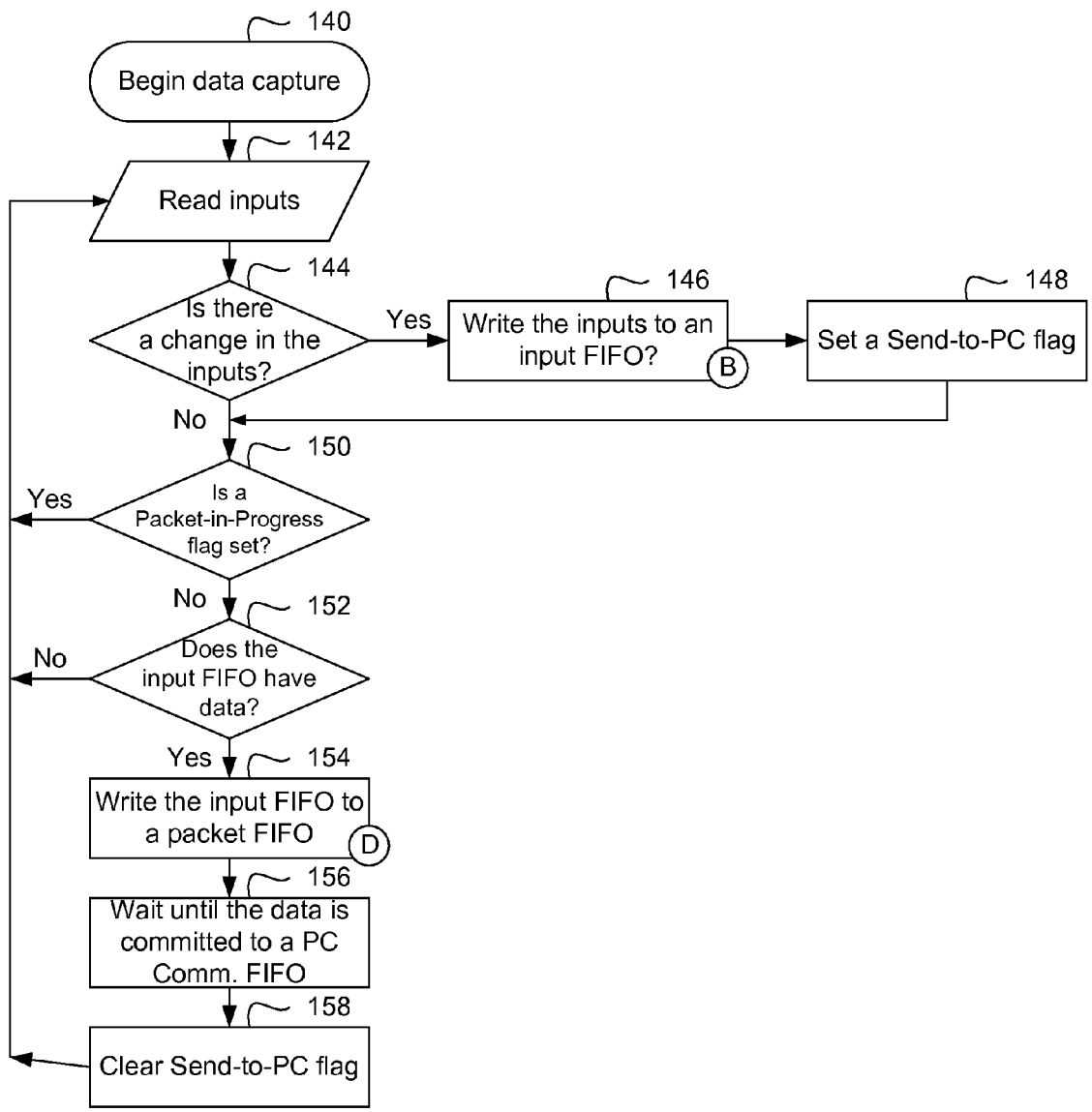
FIG. 7 illustrates a process flow for an embodiment of the present invention of the control logic for the digital inputs.

FIG. 7 illustrates a process flow for an embodiment of the present invention for the control logic for the digital inputs. Upon data capture 140, the digital input logic polls the digital inputs 142. Based on the polled inputs, the controller determines whether there is a change in the digital inputs (i.e., if the state of the input signal has changed from low to high or high to low) 144. When there is a change on the digital inputs, the system will write it to the input FIFO buffer 146, and set the send-to-PC flag 148.

Next, the logic determines whether the packet-in-progress flag is set 150. If so, then the logic loops back to read the inputs 142. If not, the input FIFO buffer is checked to determine if it has data 152. If the input FIFO buffer does not have data, then the logic loops back to read the inputs 142. If the input FIFO buffer does have data, the data in the input FIFO buffer is written to the packet FIFO buffer. Thus, data in the input FIFO buffer will only be written to the packet FIFO buffer when a packet is not in progress. In other words, when the logic gets such an opportunity, it will write all the information into the packet FIFO buffer 154.

Once the input FIFO buffer has written all the data to the packet FIFO buffer, the logic will wait until the data is committed to the PC Communication FIFO 156. Next, the logic clears the send-to-PC flag 158, and loops back to poll the inputs 142. Although it is shown here that a packet is modified in receiving one digital input, it shall be understood that more than one digital inputs may be processed as well.

It should be noted that the digital input logic will only write information to the input FIFO buffer when a change has occurred on the inputs. Otherwise, it does not cause anything to be written to the input FIFO buffer. By doing this, the digital inputs are only updated when necessary; thus conserving memory and bandwidth. Furthermore, the send-to-PC flag will cause any data in the packet FIFO buffer to be sent to the PC. If a change on one or more digital input occurs during a filtered sequence, the USB data in the packet FIFO buffer will be sent to the PC irrespective of the filter.

In alternative embodiments, the send-to-PC flag can be left enabled for a predefined period of time, after which it is cleared. This would effectively cease any filtering by the packet logic until a predefined period of time has lapsed. Likewise, the send-to-PC flag can be left enabled until a predefined number of new packets are detected on the USB interface; thereby ceasing any filtering by the packet logic and providing even more context surrounding the digital input signal.

It shall be understood that the present invention can be applied to single-packet filtered sequences, not just multi-packet filtered sequences.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A method for monitoring a USB data stream between a source and a destination, wherein said USB data stream comprises of a plurality of USB packets, comprising the steps of:

receiving a stream of one or more USB packets from a USB input line;
receiving non-USB-related signals from a general purpose input line;
processing with a processor the stream of one or more USB packets and the non-USB-related signals;
interleaving change of state information of the non-USB-related signals with the stream of one or more processed USB packets as an analysis stream without interleaving the non-USB-related signals with the stream, wherein the change of state information includes a change of state in the non-USB-related signals and a timestamp corresponding to the change of state, and wherein the change of state information of the non-USB-related signals is different from the non-USB-related signals; and
sending the analysis stream to an analysis computer.

2. The method of claim 1 wherein at least some of the non-USB-related signals causes filtering of the USB packets.

3. The method of claim 2 wherein the filtering is for the filtering of a defined type of packets.

4. The method of claim 1 wherein at least some of the non-USB-related signals ceases the filtering of the USB packets.

5. The method of claim 4 wherein the filtering is ceased for a pre-defined period of time.

6. The method of claim 4 wherein the filtering is ceased for a pre-defined number of packets.

7. The method of claim 1, wherein receiving the stream of one or more USB packets comprises storing the USB packets in a packet buffer of the analyzer.

8. The method of claim 7 wherein the USB packets are processed in the packet buffer as a function of the non-USB-related signals.

9. The method of claim 1, wherein the interleaving is based at least in part on a timing of the information.

10. A method for managing a data capture stream for a USB host and a device using an analyzer having a packet buffer, comprising the steps of:

receiving one or more USB packets from a USB input line into a packet buffer;
receiving non-USB-related signals from a general purpose input line;
if a change is detected with respect to at least some of the non-USB-related signals, recording that the change has been detected and recording a timestamp corresponding to the change;
inserting the change and the timestamp of the non-USB-related signals in the packet buffer such that the change and the timestamp are interleaved with the one or more USB packets in the packet buffer; and
generating a data capture stream from the packet buffer.

11. The method of claim 10 wherein if a change in the non-USB-related signal is received during the reception of a USB packet, recording comprises storing the change and the timestamp in an input buffer and inserting the change and the timestamp in the packet buffer after the completion in the reception of the USB packet.

12. The method of claim 11 wherein the timestamp indicates the time when the change in the non-USB-related signals was initially detected.

13. The method of claim 10 wherein the one or more USB packets are part of a filtered multi-packet sequence.

14. The method in claim 13 wherein if the change in the non-USB-related signal is received during the reception of the filtered multi-packet sequence, recording comprises storing the change and the timestamp in an input buffer and inserting the change and the timestamp in the packet buffer after the completion of a packet in the reception of the multi-packet sequence.

15. A system for monitoring a USB data stream between a source and a destination, comprising:
an interface configured to
receive a stream of one or more USB packets from a USB input line; and
receive non-USB-related signals from a general purpose input line; and
a processor coupled to the interface, configured to:
process the stream of one or more USB packets and the non-USB-related signals;
interleave change of state information of the non-USB-related signals with the stream of one or more processed USB packets as an analysis stream without interleaving the non-USB-related signals with the stream, wherein the change of state information includes a change of state in the non-USB-related signals and a timestamp corresponding to the change of state, and wherein the change of state information of the non-USB-related signals is different from the non-USB-related signals; and
send the analysis stream to an analysis computer.

16. The system of claim 15, wherein at least some of the non-USB-related signals causes filtering of the USB packets.

17. The system of claim 16, wherein the filtering is for the filtering of a defined type of packets.

18. The system of claim 15, wherein at least some of the non-USB-related signals ceases the filtering of the USB packets.

19. The system of claim 18, wherein the filtering is ceased for a pre-defined period of time.

20. The system of claim 18, wherein the filtering is ceased for a pre-defined number of packets.

21. The system of claim 15, wherein receiving the stream of one or more USB packets comprises storing the USB packets in a packet buffer of the analyzer.

22. The system of claim 21, wherein the USB packets are processed in the packet buffer as a function of the non-USB-related signals.

23. The system of claim 15, wherein the interleaving is based at least in part on a timing of the information.

24. The method of claim 1, wherein the information is interleaved in an order reflecting timing of the change of state with respect to the stream of one or more USB packets.

25. The system of claim 15, wherein the information is interleaved in an order reflecting timing of the change of state with respect to the stream of one or more USB packets.

* * * * *